US 12,193,140 B2

(12) United States Patent
Kowal

(10) Patent No.: US 12,193,140 B2
(45) Date of Patent: *Jan. 7, 2025

(54) CONTROLLER AND CONTROL TECHNIQUES FOR LINEAR ACCELERATOR AND ION IMPLANTER HAVING LINEAR ACCELARATOR

(71) Applicant: Applied Materials, Inc., Santa Clara, CA (US)

(72) Inventor: Keith E. Kowal, Swampscott, MA (US)

(73) Assignee: Applied Materials, Inc., Santa Clara, CA (US)

( * ) Notice: Subject to any disclaimer, the term of this patent is extended or adjusted under 35 U.S.C. 154(b) by 38 days.

This patent is subject to a terminal disclaimer.

(21) Appl. No.: 18/145,307

(22) Filed: Dec. 22, 2022

(65) Prior Publication Data

US 2023/0125883 A1    Apr. 27, 2023

Related U.S. Application Data

(63) Continuation of application No. 16/828,899, filed on Mar. 24, 2020, now Pat. No. 11,576,252.

(51) Int. Cl.
*H05H 7/02* (2006.01)
*H01J 37/08* (2006.01)
(Continued)

(52) U.S. Cl.
CPC .............. *H05H 7/02* (2013.01); *H01J 37/08* (2013.01); *H05H 7/22* (2013.01); *H01J 37/3171* (2013.01);
(Continued)

(58) Field of Classification Search
None
See application file for complete search history.

(56) References Cited

U.S. PATENT DOCUMENTS 5,187,645 A * 2/1993 Spalding ............... G06F 1/1615
361/679.41
D336,075 S * 6/1993 Wakefield .................... D14/353
(Continued)

FOREIGN PATENT DOCUMENTS

EP    0672332 B1    2/2000
EP    2339899 A1    6/2011
(Continued)

OTHER PUBLICATIONS

International Search Report dated Jun. 4, 2021, for the International Patent Application No. PCT/US2021/017623, filed on Feb. 11, 2021, 3 pages.
(Continued)

*Primary Examiner* — Srinivas Sathiraju
(74) *Attorney, Agent, or Firm* — KDW FIRM PLLC

(57) ABSTRACT

An apparatus may include global control module, the global control module including a digital master clock generator and a master waveform generator. The apparatus may also include a plurality of resonator control modules, coupled to the global control module. A given resonator control module of the plurality of resonator control modules may include a synchronization module, having a first input coupled to receive a resonator output voltage pickup signal from a local resonator, a second input coupled to receive a digital master clock signal from the digital master clock generator, and a first output coupled to send a delay signal to the master waveform generator.

15 Claims, 5 Drawing Sheets

(51) Int. Cl.
*H01J 37/317* (2006.01)
*H03K 5/1536* (2006.01)
*H03L 7/081* (2006.01)
*H05H 7/22* (2006.01)

(52) U.S. Cl.
CPC .......... *H03K 5/1536* (2013.01); *H03L 7/081* (2013.01); *H05H 2007/025* (2013.01); *H05H 2007/225* (2013.01)

(56) References Cited

U.S. PATENT DOCUMENTS

| | | | | |
|---|---|---|---|---|
| 5,289,183 | A * | 2/1994 | Hassett | G07B 15/063 340/928 |
| 5,406,275 | A * | 4/1995 | Hassett | G01S 13/765 340/928 |
| 7,095,348 | B1 * | 8/2006 | Sutardja | H03M 1/0863 375/259 |
| 7,113,121 | B1 * | 9/2006 | Sutardja | H03M 1/747 375/256 |
| 7,312,739 | B1 * | 12/2007 | Sutardja | H04L 25/03834 375/256 |
| 7,402,963 | B2 * | 7/2008 | Sliski | H05H 13/02 315/502 |
| 7,649,483 | B1 * | 1/2010 | Sutardja | H04L 25/0272 375/256 |
| 8,009,073 | B2 * | 8/2011 | Sutardja | H04L 25/03834 375/256 |
| 8,164,159 | B1 * | 4/2012 | Armstrong | H03B 5/1234 257/659 |
| 8,952,765 | B2 * | 2/2015 | Fisk, II | H03B 5/1237 330/296 |
| 9,390,889 | B2 * | 7/2016 | Watanabe | H01J 37/3171 |
| 10,707,050 | B2 * | 7/2020 | Kowal | H01J 37/3171 |
| 10,943,767 | B1 * | 3/2021 | Kowal | H05H 9/04 |
| 10,991,546 | B1 * | 4/2021 | Kowal | H01J 37/3171 |
| 11,165,427 | B2 * | 11/2021 | Turner | H03K 3/78 |
| 11,576,252 | B2 * | 2/2023 | Kowal | H05H 7/22 |
| 2006/0152293 | A1 * | 7/2006 | McCorquodale | H03B 5/1203 331/74 |
| 2007/0164237 | A1 * | 7/2007 | Bernhardt | H01J 37/248 250/492.21 |
| 2008/0100350 | A1 * | 5/2008 | Pernia | H03B 5/1243 331/181 |
| 2008/0104435 | A1 * | 5/2008 | Pernia | G06F 1/3203 713/322 |
| 2009/0146719 | A1 * | 6/2009 | Pernia | H03B 5/04 327/539 |
| 2009/0146748 | A1 * | 6/2009 | Pernia | H03L 1/026 331/109 |
| 2009/0146750 | A1 * | 6/2009 | Pernia | H03L 5/00 331/177 V |
| 2009/0146752 | A1 * | 6/2009 | O'Day | H03L 1/02 331/177 V |
| 2011/0224953 | A1 * | 9/2011 | Webster | G06Q 10/10 703/1 |
| 2017/0086910 | A1 * | 3/2017 | Wiener | H03K 5/01 |
| 2017/0117064 | A1 * | 4/2017 | Lepine | G21C 17/00 |
| 2020/0035446 | A1 * | 1/2020 | Kowal | H01J 37/24 |
| 2021/0307152 | A1 * | 9/2021 | Kowal | H05H 7/02 |
| 2023/0125883 | A1 * | 4/2023 | Kowal | H01J 37/24 315/505 |

FOREIGN PATENT DOCUMENTS

| | | |
|---|---|---|
| JP | H07-211500 A | 8/1995 |
| JP | 2001-085198 A | 3/2001 |
| JP | 2018-085179 A | 5/2018 |

OTHER PUBLICATIONS

Written Opinion dated Jun. 4, 2021, for the International Patent Application No. PCT/US2021/017623, filed on Feb. 11, 2021, 4 pages.

* cited by examiner

CONTROLLER AND CONTROL TECHNIQUES FOR LINEAR ACCELERATOR AND ION IMPLANTER HAVING LINEAR ACCELARATOR

CROSS-REFERENCE TO RELATED APPLICATION

This application is a continuation application of U.S. Non-Provisional application Ser. No. 16/828,899, filed Mar. 24, 2020, entitled "CONTROLLER AND CONTROL TECHNIQUES FOR LINEAR ACCELERATOR AND ION IMPLANTER HAVING LINEAR ACCELERATOR," the entire contents of which application incorporated by reference herein.

FIELD OF THE DISCLOSURE

The disclosure relates generally to ion implantation apparatus and more particularly to high energy beamline ion implanters based upon linear accelerators.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. One type of ion implanter suitable for generating ion beams of medium energy and high energy uses a linear accelerator, or LINAC, where a series of electrodes arranged as tubes around the beam accelerate the ion beam to increasingly higher energy along the succession of tubes. The various electrodes may be arranged in a series of stages where a given electrode in a given stage receives an AC voltage signal to accelerate the ion beam.

LINACs employ initial stages that bunch an ion beam as the beam is conducted through the beamline. A given stage of the LINAC is used to increase ion energy by accelerating ions using, for example, a resonator generating an RF voltage that is applied to a given electrode or set of electrodes at the given stage. The RF voltage generates an oscillating electric field that is coupled into an ion beam being conducted through the LINAC by controlling the phase and amplitude of the RF voltage applied to the given LINAC stage.

A given RF resonator will be tuned to maintain resonance for optimum coupling of RF energy into an ion beam. Because a given LINAC may employ several stages, such as four stages, six stages, twelve stages, or more, a similar number of resonators are to be controlled to accelerate an ion beam through the LINAC. These multiple resonators will need accurate control to remain resonance, such as adjustments on the scale of nanoseconds or less. The more the resonance condition is maintained the greater the ability to accelerate an ion beam is. Moreover a given resonator used to control a given stage of a LINAC may be independent of other resonators linked to other stages. Accordingly, control of multiple resonators to the degree needed to maintain resonance in multiple different stages remains a challenge.

With respect to these and other considerations, the present disclosure is provided.

BRIEF SUMMARY

In one embodiment, an apparatus may include a global control module that contains a digital master clock generator and a master waveform generator. The apparatus may also include a plurality of resonator control modules, coupled to the global control module. A given resonator control module of the plurality of resonator control modules may include a synchronization module, having a first input coupled to receive a resonator output voltage pickup signal from a local resonator, a second input coupled to receive a digital master clock signal from the digital master clock generator, and a first output coupled to send a delay signal to the master waveform generator.

In another embodiment, a linear accelerator is provided. The linear accelerator may include a plurality of stages, wherein a given stage of the plurality of stages includes an electrode assembly, and a resonator, coupled to the electrode assembly. The state may also include a resonator control assembly, coupled to the plurality of stages. The resonator control assembly may include a global control module, including a digital master clock generator and a master waveform generator, as well as a plurality of resonator control modules, coupled to the plurality of stages, and further coupled to the global control module. A given resonator control module may include a synchronization module, having a first input coupled to receive a resonator output voltage pickup signal from a local resonator, a second input coupled to receive a digital master clock signal from the digital master clock generator, and a first output coupled to send a delay signal to the master waveform generator.

In a further embodiment, a method of controlling an ion beam is provided. The method may include directing the ion beam through a linear accelerator, comprising a plurality of stages, wherein a given stage of the plurality of stages comprises an RF resonator and a resonator control module. The method may include receiving a master digital clock signal at the resonator control module, measuring a phase of a voltage signal output by the RF resonator, and adjusting a phase of an input waveform to be sent to the RF resonator according to a comparison of the phase of the voltage signal to the master digital clock signal.

Figure 1:
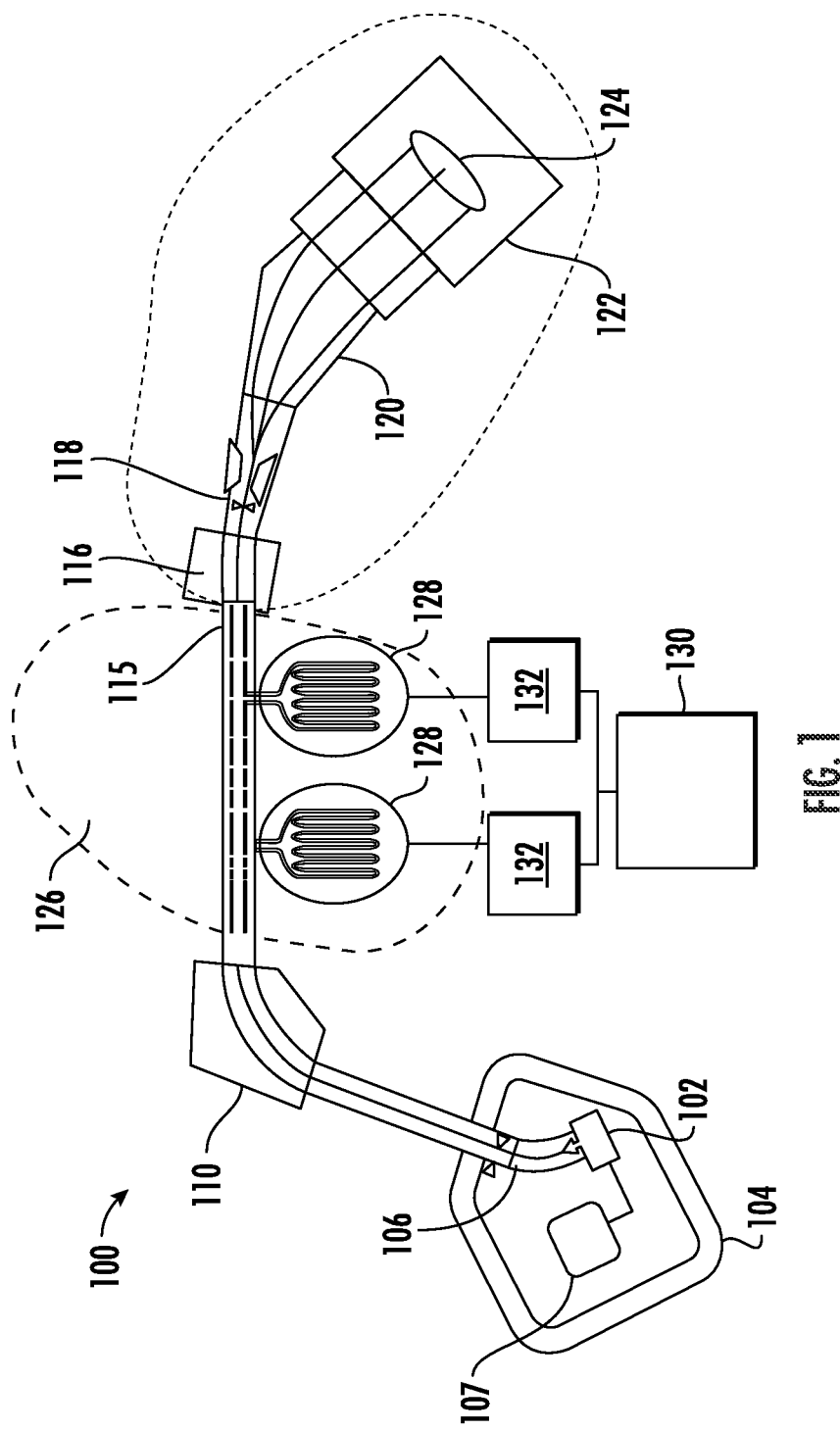
FIG. 1 shows an exemplary ion implantation system, according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved linear accelerator control, and improved high energy ion implantation systems, based upon a beamline architecture. For brevity, an ion implantation system may also be referred to herein as an "ion implanter." Various embodiments provide novel configurations for providing the capability of generating high energy ions, where the final ion energy delivered to a substrate may be 300 keV, 500 keV, 1 MeV or greater. In exemplary embodiments, a novel control arrangement and techniques are provided for controlling resonators in a LINAC having multiple stages.

Referring now to FIG. 1A, an exemplary ion implanter, shown as ion implantation system 100, is depicted in block form. The ion implantation system 100 may represent a beamline ion implanter, with some elements omitted for clarity of explanation. The ion implantation system 100 may include an ion source 102, inside an enclosure 104, and a gas box 107 held at high voltage as known in the art. The ion source 102 may include extraction components and filters (not shown) to generate an ion beam 106 at a first energy. Examples of suitable ion energy for the first ion energy range from 5 keV to 100 keV, while the embodiments are not limited in this context. To form a high energy ion beam, the ion implantation system 100 includes various additional components for accelerating the ion beam 106.

The ion implantation system 100 may include an analyzer 110, functioning to analyze a received ion beam. Thus, in some embodiments, the analyzer 110 may receive the ion beam 106 with an energy imparted by extraction optics located at the ion source 102, where the ion energy is in the range of 100 keV or below, and in particular, 80 keV or below. In other embodiments, the analyzer 110 may receive the ion beam accelerated by a DC accelerator column to higher energies such as 200 keV, 250 keV, 300 keV, 400 keV, or 500 keV. The embodiments are not limited in this context. The ion implantation system 100 may also include a linear accelerator 126 (shown in the dashed line), disposed downstream of the analyzer 110. The linear accelerator 126 may include a plurality of accelerator stages, arranged in series, as represented by resonators 128. For example, a given stage of the linear accelerator may be driven by a given resonator, generating an AC voltage signal in the MHz range (RF range), where the AC voltage signal generates an AC field at an electrode of the given stage. The AC field acts to accelerate the ion beam, which may be delivered to the stages in packets as a bunched ion beam. A buncher, not separately shown, may be located at a first stage of the linear accelerator 126, to receive a continuous ion beam and generate a bunched ion beam by action of an RF resonator at the buncher. The accelerator stages may act similarly to the buncher, to output bunched ion beams at a given stage, and to accelerate the ion beam to a higher energy in stages. Thus, a buncher may be considered to be a first accelerator stage, differing from downstream accelerator stages in that the ion beam is received as a continuous ion beam. The resonators may be controlled by resonator control modules 132 and a global control module 134, where examples of resonator control modules and global control modules are detailed below.

In various embodiments, the ion implantation system 100 may include additional components, such as a filter magnet 116, a scanner 118 and collimator 120, where the general functions of the filter magnet 116, scanner 118 and collimator 120 are well known and will not be described herein in further detail. As such, a high energy ion beam, represented by the high energy ion beam 115, after acceleration by the linear accelerator 126, may be delivered to an end station 122 for processing of a substrate 124.

In some embodiments, where the ion beam 106 is provided directly to the analyzer 110, the linear accelerator 126 may receive the ion beam 106 as a continuous ion beam at a relatively lower energy, such as less than 100 keV, as noted. In other embodiments, where the ion implantation system includes a DC accelerator column, the ion beam 106 may be accelerated to be fed as a continuous ion beam at energies of up to 500 keV or greater.

Figure 2:
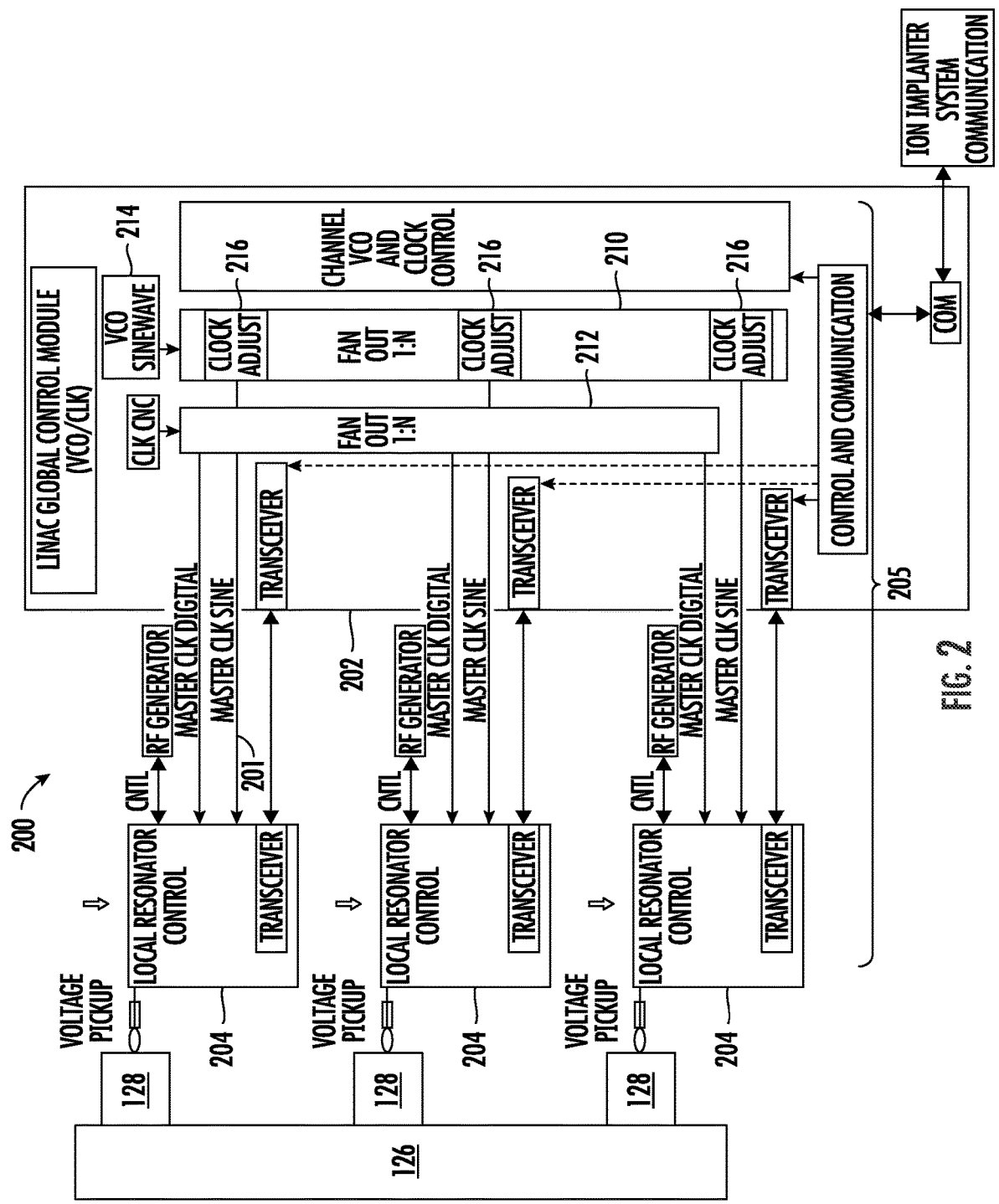
FIG. 2 illustrates an exemplary control arrangement for controlling a plurality of acceleration stages in a LINAC, in accordance with various embodiments of the disclosure.

FIG. 2 illustrates an exemplary control arrangement for controlling a plurality of acceleration stages in a LINAC, in accordance with various embodiments of the disclosure. The control arrangement 200 includes a resonator control assembly 205 that includes a global control module 202, including a digital master clock generator 212 and a master waveform generator 210, which component may be coupled to an oscillator 214. The resonator control assembly 205 may also include a plurality of resonator control modules, where the plurality of resonator control modules are shown as resonator control modules 204. A given resonator control module is coupled to the global control module 202, via at least one cable, to transmit signals between the global control module 202 and resonator control module 204. For example, at least part of the global control module 202 may be located in a rack or other component, and connected by multiple cables to the resonator control modules 204. In operation, the global control module 202 may include logic to generate and manage certain signals sent between the resonator control modules 204 and global control module 202 to manage operation of the resonators 128 for the different stages of the linear accelerator 126.

In brief, the control arrangement 200 may aid in monitoring and maintaining a precision clock and waveform provided to drive each of the resonators 128. For example, a given resonator at a given acceleration stage of the linear accelerator 126 may require sub-nanosecond control to maintain resonance, in order to produce the maximum potential to accelerate an ion beam passing through the given stage. The control arrangement 200 may monitor incoming signals to a given acceleration stage and compare the signals to a master digital clock signal generated by the global control module 202. As detailed below, the resonator control modules 204 may be arranged similarly to one another where a given resonator control module is coupled to a dedicated component, shown as clock adjust circuits 216, to adjust a master waveform 201, used to control resonator 128. The master waveform generator 210 may include a number of clock adjust circuits to match the number of resonator control modules 204. As shown in FIG. 2, the control arrangement 200 may include a voltage pickup, coupled to a given resonator of the resonators 128, to generate a resonator output voltage pickup signal. Thus, the control arrangement 200 may determine a resonator output voltage pickup signal at a resonator 128 and compare this signal to the phase of a waveform that drives the resonator 128. Any phase delay may aid in the ability to make careful clock delay measurement/adjustments so that resonance can be more accurately maintained at a given resonator.

For some or all resonators of the resonators 128, the phase delay may be determined by the control arrangement 200 and reported back to the global control module 202 to tune the resonators 128 to a targeted accuracy. Once this calibration is complete, the phase relation between the different resonators of the linear accelerator 126 will be known. In some embodiments, the master waveform generator 210 of the global control module 202 may generate a sinewave to drive the resonators 128, at a determined frequency, such as 13.56 MHz, while the digital master clock generator 212 may generate a digital signal at a multiple of the sinewave frequency, such as 27.12 MHz. Both clocks of these components may drift over time according to ambient changes, such as temperature or other factors. In accordance with embodiments of the disclosure, the control arrangement 200 acts to maintain and adjust each of the resonators 128 accordingly, to account for such changes.

Figure 3A:
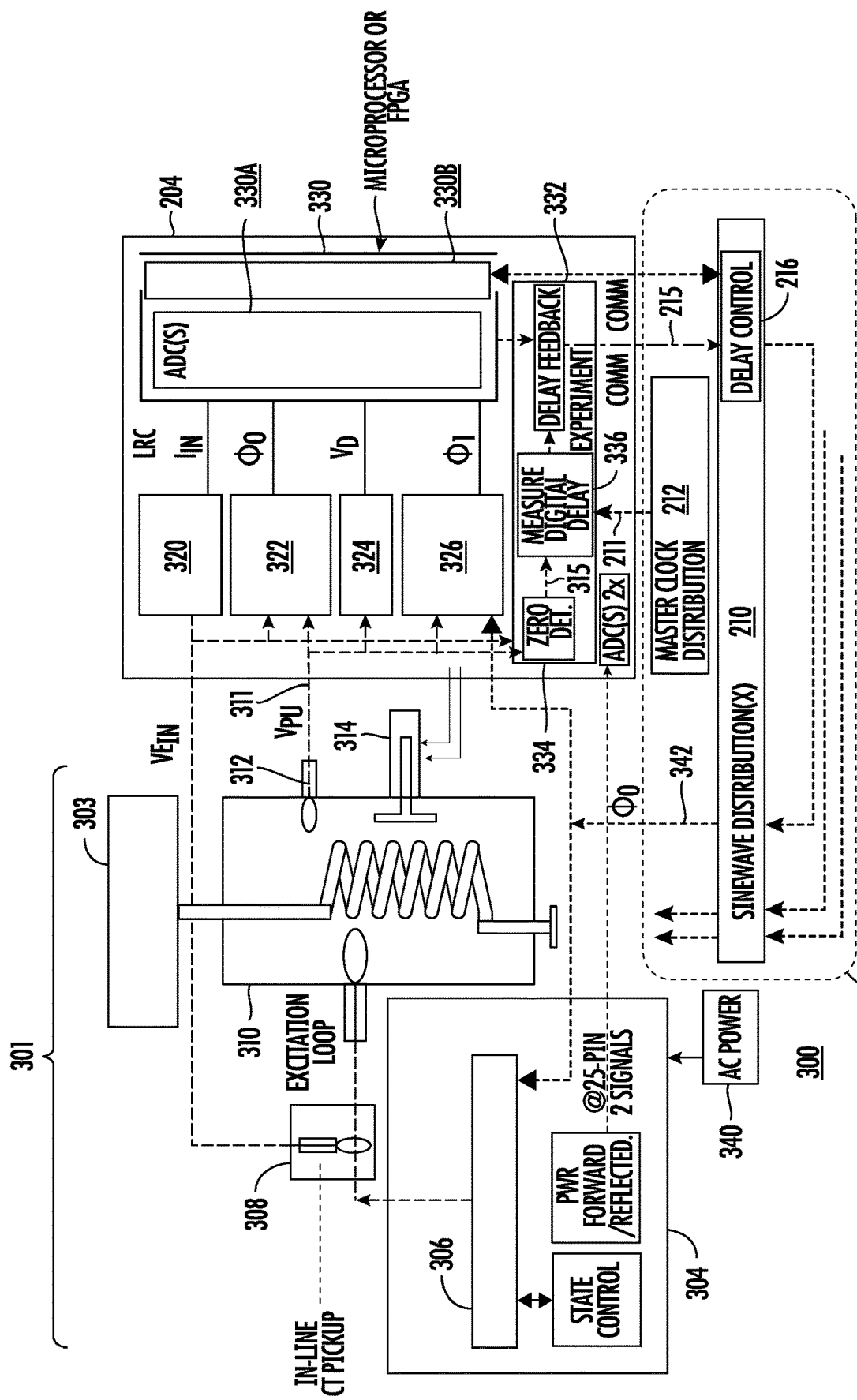
FIG. 3A shows exemplary details of a resonator controller, according to embodiments of the disclosure.

FIG. 3A shows exemplary details of one variant of a resonator control module 204, according to some embodiments of the disclosure. In FIG. 3A, the resonator control module 204 is shown in the context of a control arrangement 300, including the global control module 202, discussed above, as well as a resonator 128 and an RF source 304 (powered separately by AC power 340), that provides RF power to the resonator 128. Exemplary frequency of RF power generated by RF source 304 may be in the tens of Megahertz range up to 100 Megahertz according to some non-limiting embodiments. Exemplary power output by the RF source 304 may range in the kW to tens of kW according to some non-limiting embodiments.

Notably, in a linear accelerator of the present embodiments, for each acceleration stage a resonator 128 will be coupled to a like resonator control module. Thus, the operation of the resonator control module 204 of FIG. 3A in concert with resonator 128, will be replicated for the different acceleration stages of a linear accelerator. Said differently, in a linear accelerator having twelve acceleration stages, twelve of resonator control modules 204 may be provided to individually control twelve separate resonators. The embodiments are not limited in this context to any particular number of acceleration stages or corresponding resonators.

In operation, according to some embodiments, the master waveform generator 210 of the global control module 202 may act as an analog sinewave generator to generate a waveform, shown as waveform 342, as an analog sinewave. This waveform is amplified by RF source 304, such as by amplifier 306, and output as RF power to the resonator 128.

The control arrangement 300 may include various monitors of pickups, including a current pickup 308, arranged to measure incoming power to the resonator 128, from the RF source 304. The control arrangement 300 further includes a voltage pickup 312, arranged to measure AC (RF) voltage output by the resonator 128, and a resonance tuner 314. In the embodiment of FIG. 3, an acceleration stage 301 is represented by an RF source 304, resonator 128, and AC drift tube 303. As shown in the control arrangement 300, the RF voltage may be sent to the AC drift tube 303 of a given acceleration stage. The AC drift tube 303 may be arranged as a hollow cylinder, generating an RF field therein, used to accelerate an ion beam that passes through the AC drift tube 303. Acceleration stages will be arranged along a length of a linear accelerator, generally as depicted in FIG. 2.

To monitor and adjust operation of the acceleration stage 301, a dedicated resonator control module is provided, shown as the resonator control module 204. As shown in FIG. 3A, a resonator output voltage pickup signal is generated from a local resonator, meaning a signal from the voltage pickup 312 that is coupled to the resonator 128. The signal is shown as resonator output voltage pickup signal 311. The resonator output voltage pickup signal 311 may have the form of an analog waveform at the frequency of the waveform 342. In the control arrangement 300, this signal may be distributed to various components of the resonator control module 204, including a voltage amplitude detector 324, and voltage phase detector 326. The resonator control module 204 may further include an amplitude detector 320, and a phase detector 322, each detector being coupled to receive a Vin signal from CT pickup 308. The amplitude detector 320 and voltage amplitude detector 324 may function as "gross" tuning components of the resonator 310, while the phase detector 322 and phase detector 326 function as fine tuning components of resonator 310.

The resonator control module 204 further may include a control module 330, including an assembly of analog to digital converters, shown as ADC assembly 330A, and processing circuit 330B, which circuit may be a microprocessor of field programmable gate array (FPGA) in different non-limiting embodiments. The ADC assembly 330A may include various inputs, coupled to receive, for example, an $I_{in}$ signal from the amplitude detector 320, a φ0 signal from the phase detector 322, a $V_D$ signal from the amplitude detector 324, and a φ1 signal from the phase detector 326. These signals may be processed by the control module 330 and output to a synchronization module 332, discussed below.

In this variant, the resonator control module 204 includes a synchronization module 332, having a first input coupled to also receive the resonator output voltage pickup signal 311. In addition, the synchronization module 332 may include a second input coupled to receive a digital master clock signal 211 from the digital master clock generator 212, and a first output coupled to send a delay signal 215 to the master waveform generator 210.

The synchronization module 332 may determine a delay or offset between phase of a waveform output by the resonator 128, e.g., resonator output voltage pickup signal 31, and phase of a digital master clock signal 211 received from the digital master clock generator 212. For example, the synchronization module 332 may include a zero crossing detector 334, to determine a zero crossing event of the resonator output voltage pickup signal 311 generated from voltage pickup 312. The synchronization module 332 may further include a delay measure circuit 336, having an input to receive a zero-crossing signal 315 from the zero crossing detector 334, and an input to receive the digital master clock signal 211. By comparing the phase offset between these two signals, a delay associated with the resonator 310 may be determined. This delay may then be reported by the synchronization module 332 as a delay signal 215 to the global control module 202. Similar delay signals may be reported for each resonator of each acceleration stage of the linear accelerator 126. As such, this delay may be used to monitor, control, and adjust operation of each or the resonators of the acceleration stages 301 of the linear accelerator 126. For example, the delay signal 215 may be received by a dedicated circuit of the master waveform generator 210, shown as clock adjust circuit 216, of the global control module 202. The clock adjust circuit 216 may then output a tuning signal, so that the phase of the waveform 342 output by the master waveform generator 210 to resonator 128 may be adjusted as necessary.

Notably, in the arrangement of FIG. 3A, the voltage phase detector 326 is also coupled to receive the waveform 342 output by the master waveform generator 210. As such, the delay or phase offset between the waveform 342 as sent to the RF source 304, and the voltage waveform detected at the resonator 128 may be determined. This delay constitutes a system clock delay, and is quantified by the synchronization module 332, and is reported back to the global control module 202, for the resonator 310, and may be reported for each of the resonators 310 for each other acceleration stage 301. In this manner, the aforementioned components or circuitry of global control module 202 can determine the relative phase delay between the resonators of the different acceleration stages of a LINAC.

The control module 330 may also act as a tuning circuit, to output a tuning signal to a resonance tuner 314 of the resonator 310, based upon the phase of the output voltage pickup signal. The resonance tuner 314 may be an adjustable component such as an adjustable capacitor or other suitable component to adjust the resonator 310.

Figure 3B:
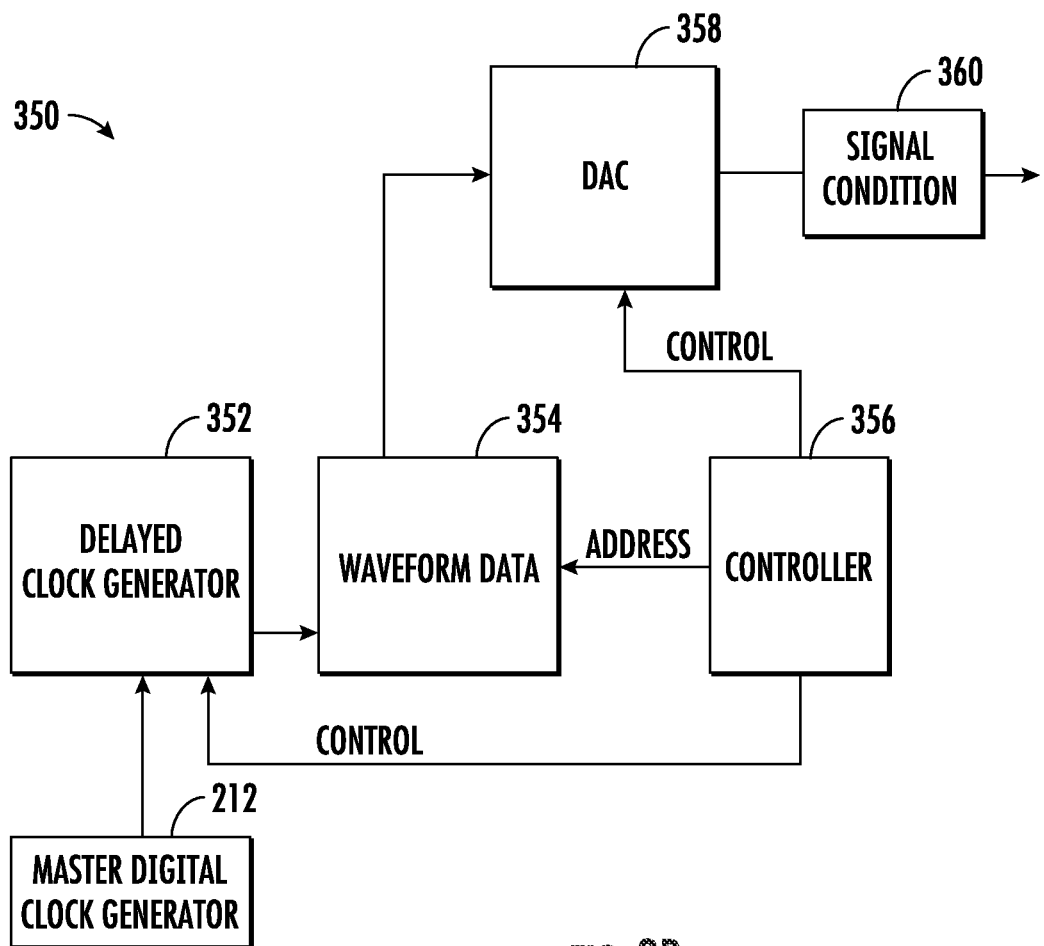
FIG. 3B depicts one implementation of a clock adjustment circuit.

FIG. 3B depicts one implementation of a clock adjustment circuit 350. The clock adjustment circuit 350 includes a delayed clock generator 352, coupled to receive a master digital clock signal from the digital master clock generator 212. The delayed clock generator 352 outputs to waveform data block 354, which block is coupled to output to a digital to analog converter 358. A controller 356 is provided having a first output to send a first control signal to the delayed clock generator, a second output to send a second control signal to the digital to analog converter 358, and an address signal to the waveform data block 354. The digital to analog converter 358 may accordingly output an analog signal to the signal condition block 360, which block, in turn, sends an adjusted waveform to a resonator and associated resonator control module.

Figure 4:
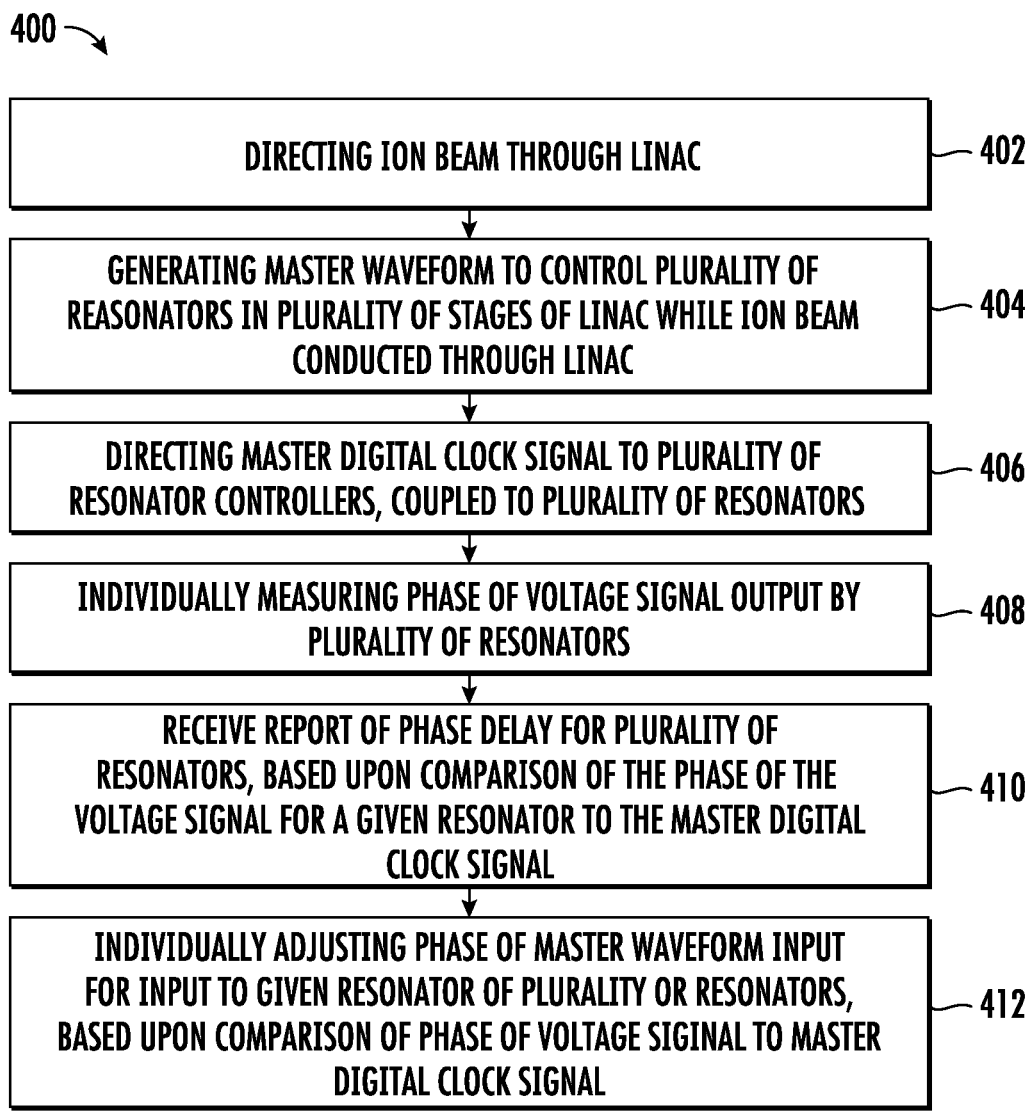
FIG. 4 depicts an exemplary process flow according to some embodiments of the disclosure.

FIG. 4 depicts an exemplary process flow 400, according to some embodiments of the disclosure. At block 402, an ion beam is directed through a linear accelerator (LINAC). The ion beam may be received into the linear accelerator as a bunched ion beam, for example, using a buncher at the first stage of a linear accelerator.

At block 404, a master waveform is generated to control a plurality of resonators at a plurality of stages of the LINAC, while the ion beam is conducted through the LINAC. The master waveform may be generated as an analog sinewave that is sent to a plurality of RF sources that amplify the master waveform to generate RF power at a plurality of RF resonators.

At block 406 a master digital clock signal is directed to a plurality of resonator controllers, coupled to plurality of resonators. The master digital clock signal may be generated at a frequency that is an integral multiple of the frequency of the master waveform.

At block 408, the phase of a voltage signal output by each resonator of a plurality of resonators of the LINAC is individually measured.

At block 410 a report of phase delay for plurality of resonators is received, where the phase delay is based upon comparison of the phase of the voltage signal for a given resonator to the master digital clock signal.

At block 412 the phase of a master waveform for input to a given resonator of the plurality of resonators may be individually adjusted, based upon comparison of phase of voltage signal to master digital clock signal In view of the foregoing, at least the following advantages are achieved by the embodiments disclosed herein. A first advantage is realized by providing a means to ensure that resonance for a given RF resonator is automatically maintained. A second advantage is the ability to determine delay more accurately at a given resonator.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
   a digital master clock generator;
   a master waveform generator to output an analog sinewave;
   a plurality of local resonator controllers, coupled to the master waveform generator and the digital master clock generator, wherein a given local resonator controller of the plurality of local resonator controllers comprises:
   a first input, coupled to receive a resonator output voltage pickup signal from a local resonator, a second input coupled to receive a digital master clock signal from the digital master clock generator, and a first output coupled to send a delay signal to the master waveform generator; and a tuning circuit, to output a tuning signal to an adjustable component of the local resonator, responsive to the resonator output voltage pickup signal.

2. The apparatus of claim 1, wherein the master waveform generator comprises a clock adjust circuit, to iteratively adjust a phase of a waveform sent to the local resonator based upon a delay signal received from the given local resonator controller.

3. The apparatus of claim 2, further comprising a zero crossing detector to determine a zero crossing event of the resonator output voltage pickup signal, wherein the delay signal is determined by a comparison of the zero crossing event to the digital master clock signal.

4. The apparatus of claim 1, wherein the given local resonator controller comprises a phase detector to receive the resonator output voltage pickup signal, and output a phase of the resonator output voltage pickup signal.

5. The apparatus of claim 1, wherein the master waveform generator comprises a plurality of clock adjust circuits, wherein the plurality of clock adjust circuits are individually coupled to the plurality of local resonator controllers.

6. The apparatus of claim 1, further comprising:
   a phase detector, the phase detector being coupled to receive the resonator output voltage pickup signal from the local resonator, and further coupled to receive a master clock waveform from the master waveform generator; and
   circuitry to determine a phase delay between the resonator output voltage pickup signal and the master clock waveform, and output the phase delay.

7. The apparatus of claim 1, wherein a frequency of a waveform generated by the master waveform generator is at least 10 MHz and less than 100 MHz.

8. The apparatus of claim 1, wherein a frequency of a digital clock signal generated by the digital master clock generator comprises a first frequency that is an integral multiple of a second frequency, corresponding to a frequency of a master waveform generated by the master waveform generator.

9. A linear accelerator, comprising:
a plurality of stages, wherein a given stage of the plurality of stages comprises a local resonator; and a resonator control assembly, coupled to the plurality of stages, the resonator control assembly comprising:
- a digital master clock generator, to generate a digital master clock signal; a master waveform generator, to output an analog sinewave; and
- a plurality of local resonator controllers, coupled to the master waveform generator and the digital master clock generator, wherein a given local resonator controller comprises:
  - a first input coupled to receive a resonator output voltage pickup signal from the local resonator, a second input coupled to receive the digital master clock signal, and a first output coupled to send a delay signal to the master waveform generator; and
  - a tuning circuit, to output a tuning signal to an adjustable component of the local resonator, responsive to the resonator output voltage pickup signal.

10. The linear accelerator of claim 9, wherein the master waveform generator comprises a clock adjust circuit, to iteratively adjust a phase of a waveform sent to the local resonator based upon a delay signal received from the given local resonator controller.

11. The linear accelerator of claim 10, further comprising a zero crossing detector to determine a zero crossing event of the resonator output voltage pickup signal, wherein the delay signal is determined by a comparison of the zero crossing event to the digital master clock signal.

12. The linear accelerator of claim 9, wherein the given local resonator controller comprises a phase detector to receive the resonator output voltage pickup signal, and output a phase of the resonator output voltage pickup signal.

13. The linear accelerator of claim 9, wherein the master waveform generator comprises a plurality of clock adjust circuits, wherein the plurality of clock adjust circuits are individually coupled to the plurality of local resonator controllers.

14. The linear accelerator of claim 9, further comprising:
a phase detector, the phase detector being coupled to receive the resonator output voltage pickup signal from the local resonator, and further coupled to receive a master circuitry to determine a phase delay between the resonator output voltage pickup signal and a master waveform, and output the phase delay.

15. The linear accelerator of claim 9, wherein a frequency of a digital clock signal generated by the digital master clock generator comprises a first frequency that is an integral multiple of a second frequency, corresponding to a frequency of a master waveform generated by the master waveform generator.

* * * * *